United States Patent [19]

Tsukii et al.

[11] Patent Number: 4,772,858
[45] Date of Patent: Sep. 20, 1988

[54] DISTRIBUTED AMPLIFYING SWITCH/RF COMBINER

[75] Inventors: Toshikazu Tsukii, Santa Barbara, Calif.; Yalcin Ayasli, Lexington, Mass.

[73] Assignee: Raytheon Company, Lexington, Mass.

[21] Appl. No.: 117,123

[22] Filed: Nov. 4, 1987

[51] Int. Cl.[4] ............................ H03F 3/16; H03F 3/60
[52] U.S. Cl. ....................................... 330/277; 330/54; 330/286
[58] Field of Search ................... 330/53, 54, 277, 286, 330/287, 55

[56] References Cited

U.S. PATENT DOCUMENTS

4,486,719 12/1984 Ayasli ............................. 330/54 X
4,660,006 4/1987 Tajima et al. ................... 330/286 X Primary Examiner—Eugene R. LaRoche
Assistant Examiner—Steven J. Mottola
Attorney, Agent, or Firm—Denis G. Maloney; Richard M. Sharkansky

[57] ABSTRACT

A distributed circuit includes a plurality of field effect transistors (FETS), each one of such FETS having gate, drain and source electrodes, with a first portion, or a first channel, of such FETS having gate electrodes and drain electrodes successively coupled between a first input terminal and an output terminal, and a second like portion or a second channel of such FETS having gate electrodes and drain electrodes successively coupled between a second input terminal and said output terminal. Separate bias circuits are provided to the input electrodes of the first and second channels. Bias signals fed to the bias circuits and coupled to the input electrodes place the FETS in an "on" state to provide gain to r.f. input signals fed thereto, or in a "pinch-off" state to isolate r.f. signals fed to the input electrodes of the FETS. Accordingly, a 2×1 switch or a two way active r.f. combiner which provides gain to a signal is provided.

12 Claims, 8 Drawing Sheets

DISTRIBUTED AMPLIFYING SWITCH/RF COMBINER

BACKGROUND OF THE INVENTION

This invention relates generally to radio frequency circuits and more particularly to radio frequency distributed circuits.

As is known in the art, radio frequency amplifiers configured as distributed amplifiers having a plurality of successively interconnected field effect transistors have been suggested to provide amplification of radio frequency signals. One such distributed amplifier is shown in an article entitled "2–20 GHz GaAs Travelling-Wave Power Amplifier" by Y. Ayasli et al. IEEE MTT, Vol. 32, pp. 290–294, Mar 1984. In this article is described common drain line combining techniques in which the drains from a pair of channels of successively coupled transistors are combined using a common drain line. The motivation for this technique is to increase the output power of the distributed amplifier. This is successfully accomplished by permitting the total power fed to the input circuit to be doubled, while also doubling the maximum input gate periphery for the amplifier. This provides a concomitant increase in the drain or output periphery and a corresponding reduction in the required load line output impedance bringing this value closer to the actual output impedance of the amplifier.

Electronic Support Measure Systems (ESM) are generally broadband systems, which must operate over various r.f. frequency bands to detect the presence of emitters. One type of subsystem commonly used in ESM systems is a system which measures the angle of arrival (AOA) of an emitter.

Several general techniques are used to measure angle of arrival. One technique compares or samples received signals from multiple antenna sources of the ESM system. Generally, these signals are directed to a central signal processing chain which may make various determinations on the received signals.

Figure 1:
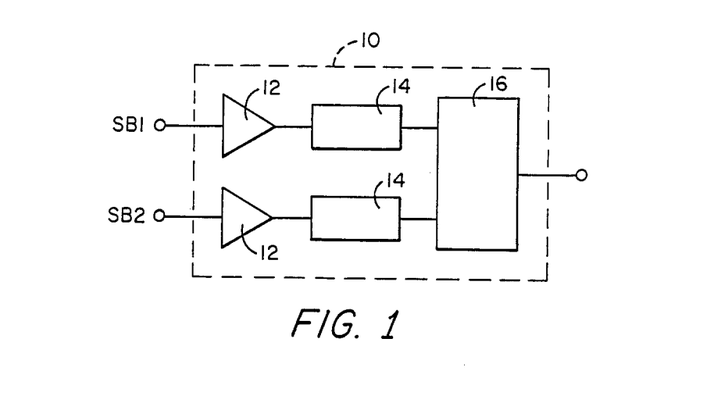
FIG. 1 is a block diagram of a conventional multi-subband amplifier/switch chain.
Figure 1A:
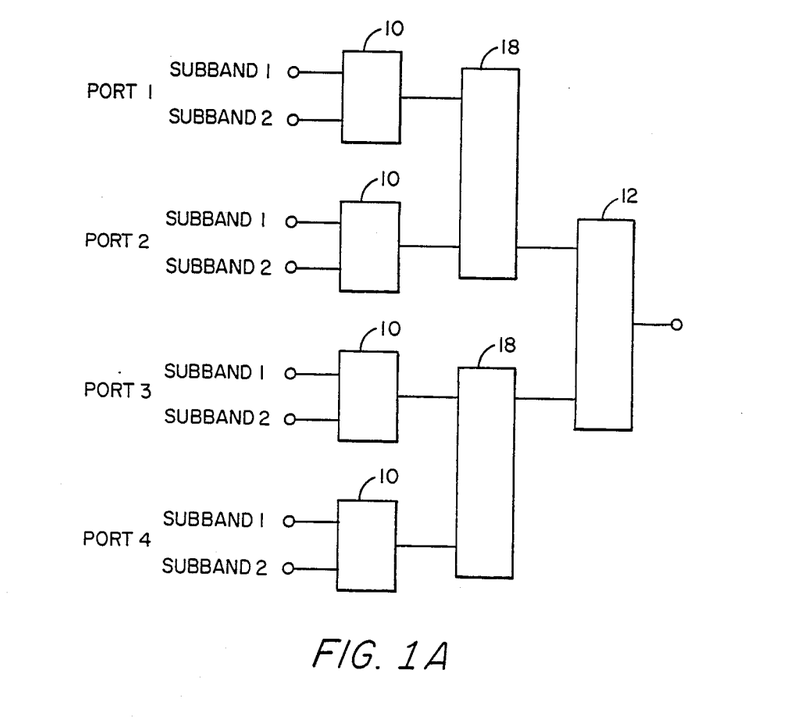
FIG. 1A is a block diagram of amplifier/switch chain of FIG. 1 configured to form a 4×1 broadband commutating switch.

One technique to direct received signals is shown in FIGS. 1 and 1A. A conventional broadband amplifier/switch and combiner element 10 is shown in FIG. 1 to include preamplifiers 12, SPST switches 14 and an r.f. multiplexer 16. Due to generally prevailing requirement that AOA systems cover various frequency bands, often it is required to divide the input signal into various subbands SB1–SB2, as shown in FIG. 1. Division into subbands generally require complex filtering arrangements (not shown) which increase system noise, complexity, and cost. The broadband requirement also makes the design of the r.f. multiplexer 16 complicated. With the presence of the r.f. switches 14 and multiplexer 16 in the element 10, preamplifiers 12 are needed to minimize the noise figure and to compensate for the insertion loss of the chain.

Electronic Counter Measures Systems (ECM) also are generally broadband, and have general applications for jamming a variety of emitters. Often it would be desireable to have a single path which may choose between a plurality of broadband, selectively modulated waveform signals for ultimate transmission as a jamming signal.

Accordingly, there exists the need for an improved switch/combiner element which operates over a broad range of frequencies.

SUMMARY OF THE INVENTION

In accordance with the present invention, a distributed amplifier switch and r.f. combiner includes a plurality of field effect transistors, each one of such field effect transistors having gate, drain and source electrodes, with each source electrode being coupled to a reference potential through a common radio frequency and direct current electrical path. A first portion or set of such field effect transistors is successively coupled between a first input terminal and an output terminal to provide a first channel. The gate electrode of each transistor in the first channel is successively electrically connected by a first r.f. transmission line having a first end coupled to the first input terminal, and a second end connected to a first circuit which provides a first switchable bias signal to the gate electrode. A second like portion of such field effect transistors is successively coupled between a second input terminal and the output terminal to provide a second channel. The gate electrode of each transistor in the second channel is successively electrically connected by a second r.f. transmission line having a first end coupled to the second input terminal, and a second end connected to a second circuit which provides a second switchable bias signal to the gate electrode. The drain electrode of each one of the field effect transistors is interconnected by a common drain output transmission line, with the drain electrode of each field effect transistor of the first channel being coupled at a common junction along such output transmission line to the drain electrode of a corresponding one of each field effect transistor of the second channel. Preferrable, electrical pathlengths between the first input terminal and the output terminal through each one of the field effect transistors of the first channel are substantially equal to the electrical pathlengths between the second input terminal and the output terminal through each one of the field effect transistors of the second channel. With such an arrangement, a circuit is provided which combines the functions of amplifying, switching, and combining signals from a plurality of sources. This circuit accordingly eliminates the need for a circuit chain comprising individual amplifiers, switches, and combiners, thereby improving system noise performance, reducing system cost and complexity. Further, since the first and second channels of transistor are successively coupled by transmission lines, the reactance of said lines may be taken into consideration to provide very broadband amplifying switch and r.f. combiner circuits, thus eliminating the need for dividing an input signal into subbands. Further, such a circuit provides a signal path which may be used to choose between a plurality of broadband, selectively modulated waveforms.

Brief Description of the Drawings

The foregoing features of the invention, as well as the invention itself, may be more fully understood from the following detailed description of the drawings, in which.

DESCRIPTION OF THE PREFERRED EMBODIMENT

Figure 2:
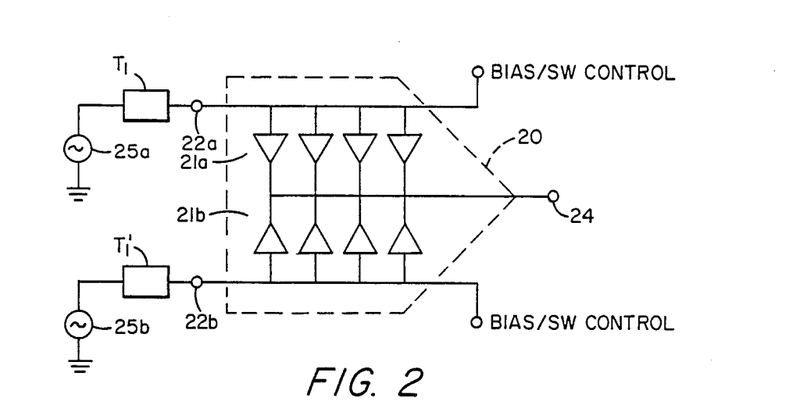
FIG. 2 is a block diagram of an amplifier/switch/r.f. combiner element in accordance with the present invention.
Figure 2A:
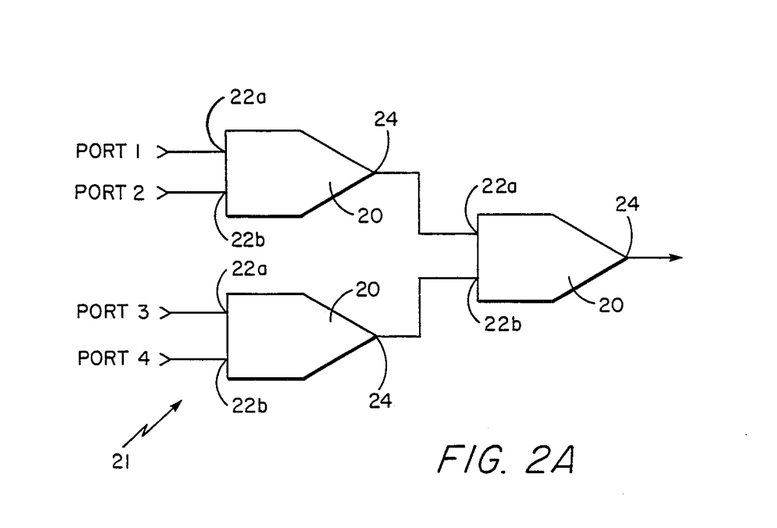
FIG. 2A is a block diagram of the elements in FIG. 2 configured to form a 4×1 broadband commutating switch.
Figure 3:
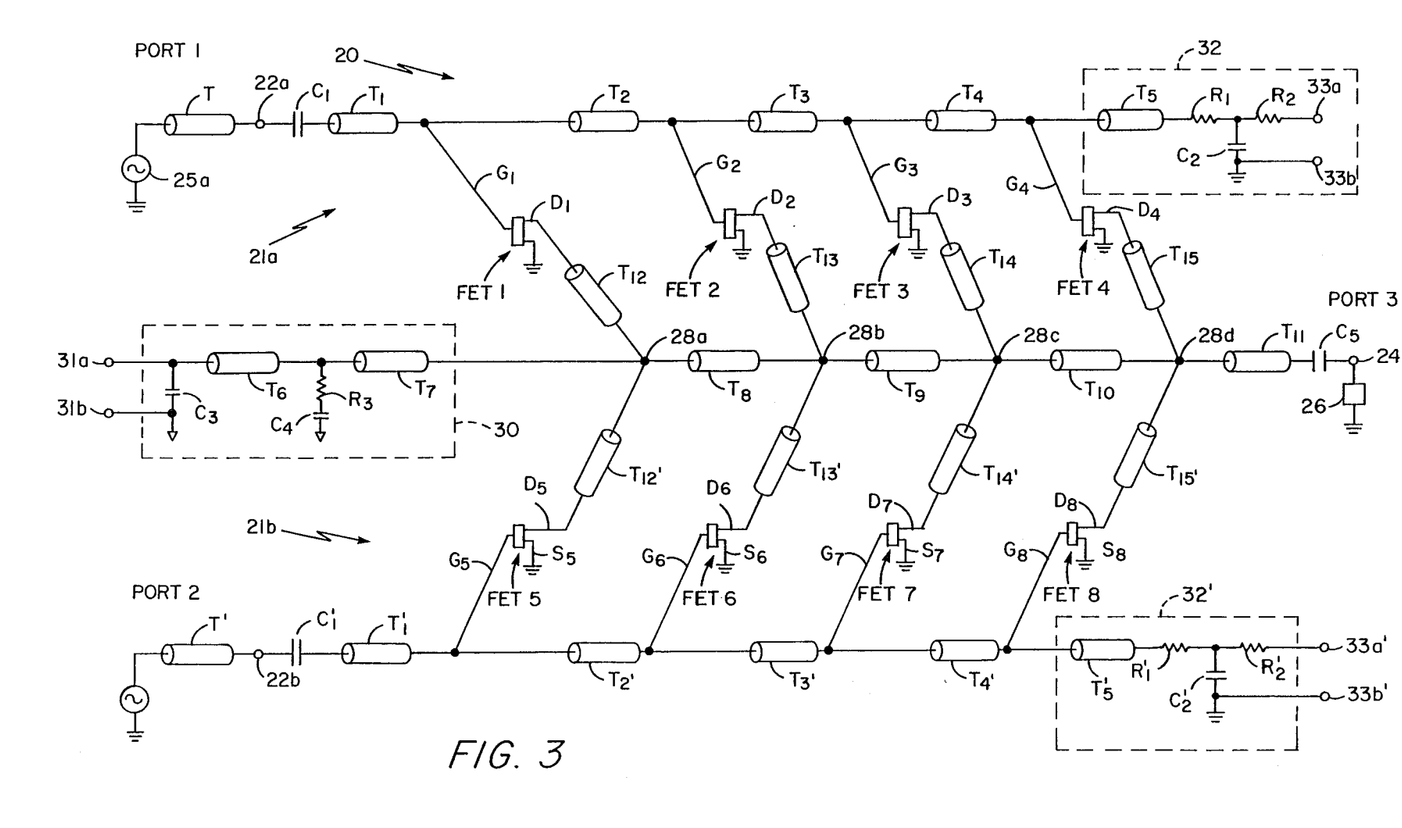
FIG. 3 is a schematic of the amplifier/switch/combiner element of FIG. 2.

Referring now to FIGS. 2, 2A, and 3, a distributed amplifier/switch/combiner 20 is shown to include a plurality of channels, here 21a, 21b, with each channel 21a, 21b being interconnected between a corresponding one of a pair of input terminals 22a, 22b and a common output terminal 24 to provide amplification, switching, and r.f. combining of radio frequency signals fed to input terminals 22a, 22b from a pair of signal sources 25a, 25b, via transmission lines T, T', here microstrip transmission lines, and D.C. blocking capacitors $C_1$, $C_1'$ such amplified radio frequency signals appearing at the output terminal 24 and being fed to a load 26. Each one of the plurality of channels 21a, 21b includes a plurality of here four field effect transistors with FET 1, FET 2, FET 3, FET 4 being associated with channel 21a and with FET 5, FET 6, FET 7 and FET 8 being associated with channel 21b.

Referring in particular to FIG. 3, the field effect transistors FET 1 to FET 8 are here metal electrode semiconductor field effect transistors (MESFET). The field effect transistors FET 1 to FET 4 here forming the first channel 21a have input electrodes, here gate electrodes $G_1$ to $G_4$ respectively successively electrically interconnected via transmission lines, here microstrip transmission lines $T_2$, $T_3$, $T_4$, respectively, as shown. The output electrodes, here drain electrodes $D_1$, $D_2$, $D_3$ and $D_4$ of such field effect transistors FET 1 to FET 4, respectively, are successively electrically interconnected via transmission lines, here microstrip transmission lines $T_{12}$-$T_{15}$ and $T_8$-$T_{10}$, as shown. Source electrodes $S_1$ to $S_4$ of the transistors FET 1 to FET 4, respectively, are coupled to a reference potential, here ground, through a common r.f. and D.C. electrical path, as shown. The gate electrode of the first one of the field effect transistors FET 1, here gate electrode $G_1$ of transistor FET 1 is connected to the transmission line $T_1$ and coupled to input terminal 22a, via D.C. blocking capacitor $C_1$ and transmission line T. The output electrode, i.e. drain electrode $D_1$ of the first field transistor FET 1 is coupled to a drain DC bias circuit 30, via transmission line here a microstrip transmission line $T_{12}$, as shown. A succeeding one of the field effect transistors, here the last or fourth field effect transistor FET 4, has input or gate electrode $G_4$ connected to a first gate DC bias/switch drive circuit 32, as shown. The output or drain electrode $D_4$ of such transistor FET 4 is connected to the output terminal 24 through transmission line $T_{15}$ and serially connected transmission line $T_{11}$, and D.C. blocking capacitor $C_5$, as shown.

In a similar manner, the second channel 21b of the distributed amplifier/switch/combiner 20 includes field effect tranistors (FET 5-FET 8), here also metal electrode semiconductor field effect transistors (MESFET). The field effect transistors FET 5-FET 8 have input electrodes, here gate electrodes $G_5$-$G_8$, respectively, successively electrically interconnectd via transmission lines $T_2'$, $T_3'$, $T_4'$, respectively, as indicated. The output electrodes, here drain electrodes $D_5$, $D_6$, $D_7$ and $D_8$ of such field effect transistors FET 5-FET 8, respectively, are successively electrically interconnected via transmission lines, here microstrip transmission lines $T_{12}'$-$T_{15}'$ and $T_8$-$T_{10}$. Thus, as shown in FIG. 3, the drain electrodes $D_1$-$D_8$ are coupled to a common, serially interconnected microstrip transmission line, comprised of microstrip transmission lines $T_{8-T10}$. As also shown, drain electrodes $D_1$ to $D_4$ and $D_5$ to $D_8$ are preferably coupled to the transmission lines at common junctions 28a-28d, as shown. That is, drain electrodes $D_1$ and $D_5$ are coupled to transmission line $T_8$ at common junction 28a, and succeeding ones of drain electrodes $D_2$-$D_4$ and $D_6$-$D_8$ are coupled with succeeding ones of transmission lines $T_9$ and $T_{10}$ at corresponding common junctions 28b-28d. Source electrodes $S_5$-$S_8$ of transistors FET 5-FET 8, respectively, are coupled to a reference potential, here ground, through a common r.f. and DC electrical path, as shown. The gate electrode of the first one of the field effect transistors, here the gate electrode $G_5$ of field effect transistor FET 5 is connected to the transmission line $T_1'$ and is coupled to input terminal 22b through a second D.C. blocking capacitor $C_1'$, as shown. The output electrode i.e. drain electrode $D_1$ of the first field effect transistor FET 5 is coupled to the drain DC bias circuit 30, as shown, via the microstrip transmission line section $T_{12}'$. A succeeding one of the field effect transistors, here the last or fourth field effect transistor FET 8 has its input or gate electrode $G_8$ connected to a second gate, D.C. bias/switch drive circuit 32', as shown, and the output or drain electrode $D_8$ of such transistor FET 8 is connected to the output terminal 24 through transmission line $T_{11}$ and the DC blocking capacitor $C_5$, as previously described.

It is noted that electrical pathlengths between the input terminal 22a and output terminal 24 through field effect transistors FET 1-FET 4 are substantially equal to the electrical pathlengths between the input terminal 22b and output terminal 24 through each corresponding one of transistors FET 5-FET 8. That is, the lengths of the transmission line sections $T_1$-$T_4$, $T_1'$-$T_4'$, $T_{12}$-$T_{15}$, $T_{12}'$-$T_{15}'$, and $T_8$-$T_{10}$ used to interconnect field effect transistors FET 1-FET 8 and the phase or delay characteristics of FET 1-FET 8 are selected in combination to provide such equal electrical pathlengths.

Here input transmission lines T, T' have a characteristic impedance of 50 ohms, and the impedance of lines $T_1$ to $T_4$ and $T_1'$ to $T_4'$ is chosen in accordance with the gate to source reactance of each one of the FETS to provide each of the channels 21a, 21b of the distributed amplifying switch/r.f. combiner 20 with an input impedance matched to the characteristic impedance of transmission lines T, T' 40 .

The drain bias circuit 30 is here a ladder network having two shunt pads to ground, via a capacitor $C_3$ and a resistor $R_3$ connected in series with capacitor $C_4$, with here microstrip transmission lines $T_6$ and $T_7$ as series elements of such ladder network. The input terminals 31a, 31b are adapted for coupling to a drain electrode DC bias source, such as $V_{DD}$, as shown. Capacitors $C_3$ and $C_4$ provide low impedance shunt paths to ground for radio frequency signals, to prevent such radio frequency signals from being coupled to the DC bias source $V_{DD}$. A direct current path is provided through transmission lines $T_6$ and $T_7$. Since $R_3$ is capacitively coupled to ground, D.C. power is not dissipated by resistor $R_3$. Thus, direct current from drain bias source $V_{DD}$ is allowed to pass from terminal 21a through the strip conductors of microstrip transmission lines $T_8$-$T_{10}$, $T_{12}$-$T_{15}$, and $T_{12}'$-$T_{15}'$, lines $T_5$, $T_6$, and $T_7$, and then return to ground through the ground source electrodes $S_1$-$S_8$, respectively.

The gate bias/switch drive circuit 32 is also a ladder network and includes serially connected resistors $R_1$, $R_2$ and transmission line $T_5$, here a microstrip transmission line to provide a direct current path between the gate electrode $G_4$ and a gate bias switch drive voltage fed to terminals 33a, 33b. Here again a radio frequency bypass capacitor $C_2$, provides a low impedance path to ground to shunt radio frequency signals to ground and thereby isolate the gate bias/switch drive source. Thus, the gate bias/switch drive source is coupled to the gate electrode $G_1$-$G_4$ by strip conductors (not shown) of microstrip transmission lines $T_2$, $T_3$, and $T_4$.

A second gate bias/switch drive circuit 32' here identical to 32 above is connected between terminals 33a', 33b', as shown.

In operation, a first r.f. input signal from a first r.f. source 25a is fed to input terminal 22a, and via transmission line $T_1$ is coupled to the gates $G_1$-$G_4$ of transistors FET 1-FET 4. A second r.f. signal from a second r.f. source 25b is fed to the gate $G_5$-$G_8$ of transistors FET 5-FET 8. With input terminal 22a defined as port 1, input terminal 22b defined as port 2, and output terminal 24 defined as port 3, one of the input signals may be selectively switched to the output terminal. Transfer from port 1 to port 3 or port 2 to port 3 is accomplished by applying a proper bias signal at terminals 33a, 33b, and 33a', 33b'.

To switch a signal from port 1 to port 3, a gate bias is fed to bias terminals 33a, 33b which turns "on" FETS 1-FET 4. Preferable, the bias is applied so that the transistors FET 1-FET 4 are bias for maximum gain. The bias applied to 33a', 33b' for the second channel is such that FET 5-FET 8 are biased at "pinch off". Accordingly, an amplified version of the signal fed to port 1 is provided at port 3.

Conversely, if transfer between port 2 and port 3 is desired, bias signals at terminals 33a', 33b' are selected to turn FET 5-FET 8 "on" whereas bias signals at terminals 33a, 33b are selected to "pinch off" FET 1-FET 4.

To use as an r.f. combiner, bias signals are fed to both terminals 33a, 33b and 33a', 33b' to bias both channels 21a, 21b of transistor in the "on" state. In this mode amplified signals from FET 1 and FET 5 are coupled to transmission line $T_5$, and are combined at junction 28a with the combined signals propagating through transmission line $T_5$ and succeeding transmission lines $T_6$, $T_7$. The combined signals are likewise combined with signals from succeeding ones of transistors FET 2-FET 4 and FET 6-FET 8 at succeeding ones of junctions 28b-28d. The combined signals at junction 28d are then coupled to output terminal 24.

Figure 4:
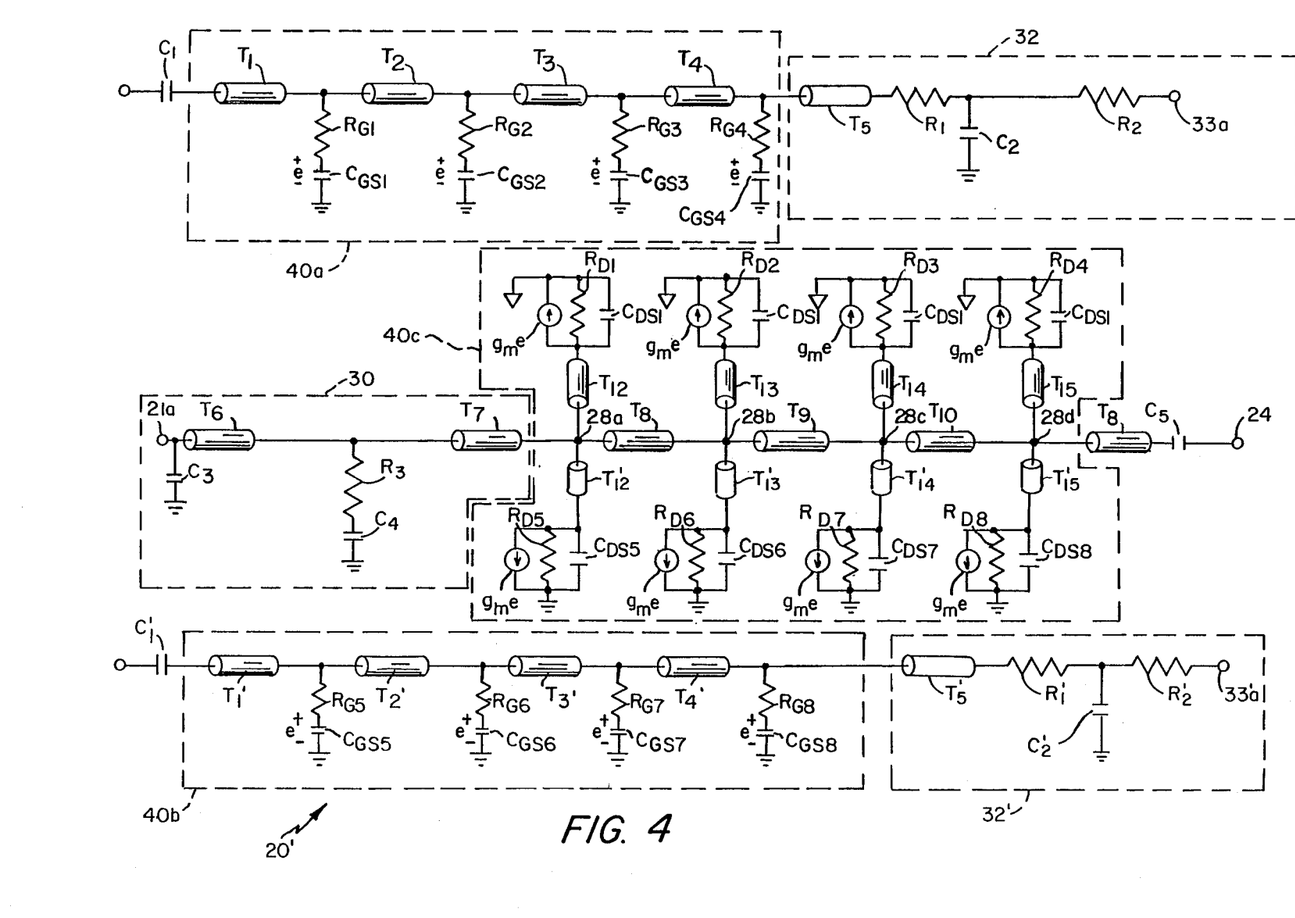
FIG. 4 is a schematic diagram of an equivalent circuit somewhat simplified of the amplifier/switch/combiner element of FIG. 3.

Referring now to FIG. 4, it is noted that the equivalent circuit 20' of the distributed amplifying switch/r.f. combiner 20 (FIG. 3) includes the inherent capacitance between the gate and source electrodes of each of the field effect transistors FET 1-FET 8, as represented by capacitors $C_{GS1}$ to $C_{GS8}$ and includes an inherent gate resistance as represented by resistors $R_{G1}$ to $R_{G8}$, respectively. Also included are the drain resistances $R_{D1}$ to $R_{D8}$ of such transistors FET 1-FET 8, respectively, and the inherent drain-source capacitance $C_{DS1}$ to $C_{DS8}$, respectively, of such transistors. In the switch mode, the inherent capacitances of the "pinch-off" FETS must also be included in any design since this capacitance tends to load the output drain transmission line. It is noted that each field effect transistor includes in the equivalent circuit thereof a current source which produces a current $g_m e$ where $g_m$ is the transconductance of such transistor, and e is the voltage across the source-gate capacitance $C_{GS}$ of such transistors as indicated. The characteristic impedance of the tranmission lines $T_2$, $T_3$, $T_4$ as well as $T_2'$, $T_3'$, $T_4'$ are selected in accordance with the gate to source capacitance $C_{GS1}$ to $C_{GS8}$ and the gate resistance $R_{G1}$ to $R_{G8}$ to provide ladder networks 40a, 40b, each with an input impedance matched to the characteristic impedance of transmission line T and the signal source 25a (FIG. 3), here each equal to 50 ohms. It is noted that networks 40a, 40b include microstrip transmission lines and provide predetermined characteristic impedances, as discussed in U.S. Pat. No. 4,486,719 and assigned to the same assignee as the present invention. It is also noted that the impedance of networks 40a, 40b is also a function of the impedance of the biasing networks 32, 32' respectively, which are here complex in order to provide optimum performance of the circuit over the operating bandwidth. The real portion of such complex impedance is provided in part by resistors $R_1$, $R_2$ and $R_1'$, $R_2'$, respectively.

It is also noted that the impedance of transmission lines $T_8$-$T_{10}$, $T_{12}$-$T_{15}$, and $T_{12}'$-$T_{15}'$ is selected in accordance with the inherent capacitances $C_{DS1}$-$C_{DS8}$ to provide the distributed amplifying switch/r.f. combiner 20 with a network 40c having a predetermined output impedance related to the characteristic impedance of the load 26 (FIG. 3) in a similar manner as described above. It is also noted that the characteristic impedance of network 40c is also related to the impedance of bias network 30 which has a real portion provided by series resistor $R_3$.

Figure 5:
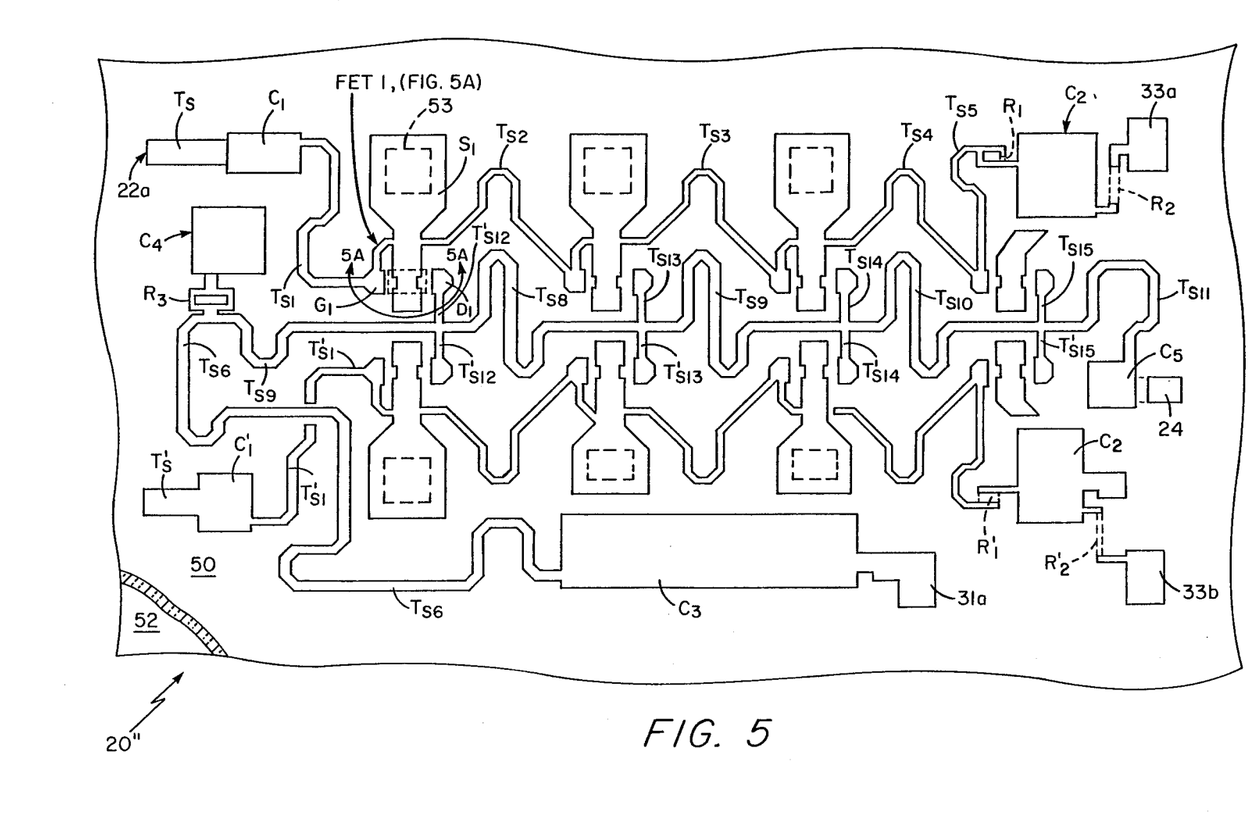
FIG. 5 is a plan view of an amplifier/switch/combiner element of FIG. 1 fabricated as a monolithic integrated circuit.
Figure 5A:
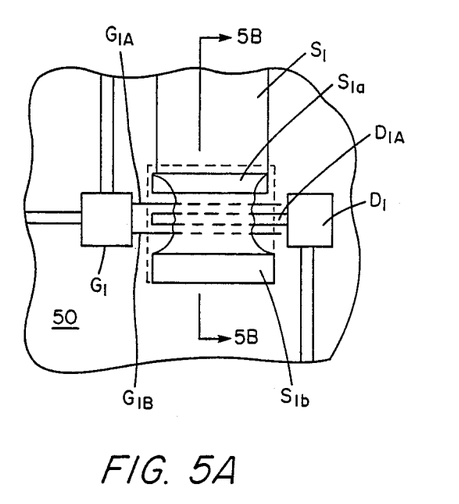
FIG. 5A is an enlarged plan view of a portion of FIG. 5 taken along line 5A—5A of FIG. 5.
Figure 5B:
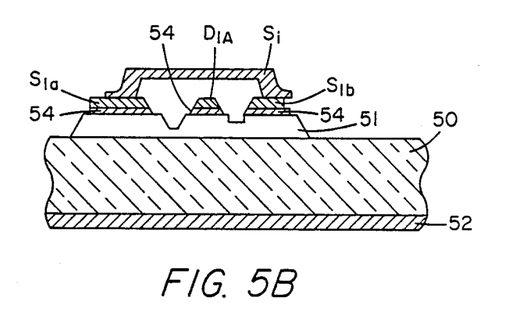
FIG. 5B is a cross-sectional view taken along line 5B—5B of FIG. 5A.

Referring now to FIGS. 5, 5A, and 5B, the distributed amplifying switch/r.f. combiner 20 (FIG. 3) is shown as a monolithic integrated circuit 20" formed on a substrate 50, here of gallium arsenide having a ground plane conductor surface 50 formed on a bottom surface portion thereof and mesa-shaped epitaxial layers 51 and ohmic contact areas 54 were formed on portions of the upper surface of substrate 50, such surface being opposite to the surface of the ground plane conductor 52, to provide active regions for forming the transistors FET 1-FET 8. Source electrodes of each one of the transistors FET 1-FET 8 are electrically connected to the ground plane conductor 52 by plating through via holes 53 provided in substrate 50, as is known in the art. Further, each one of the field effect transistors FET 1-FET 8 is here identical in construction, with each one thereof a drain electrode, pairs of gate electrodes connected to common gate pad $G_1$–$G_8$, and source regions connected by an overlay metalization. Thus, considering an exemplary one of such field effect transistors FET 1–FET 8, here FET 1, as shown in FIGS. 5A, 5B such transistor is shown to have a common drain contact $D_1$ and a pair of source contacts $S_{1a}$, $S_{1b}$ spaced from a drain contact $D_{1a}$ by a pair of gate electrodes $G_{1a}$, $G_{1b}$, as shown. The gate electrodes $G_{1a}$, $G_{1b}$ are connected together at a common gate contact here and in FIG. 1 indicated by designation $G_1$. It is also noted that source contacts $S_{1a}$, $S_{1b}$ are electrically interconnected through overlay conductor $S_1$. As previously mentioned, it is noted that all the transmission lines formed hereon are microstrip transmission lines. The microstrip transmission lines are formed by the ground plane 52 being spaced from patterned strip conductor portions $T_{s1}$–$T_{s20}$ by a dielectric, here provided by the semi-insulating gallium arsenide substrate 50, as shown in FIG. 5. Capacitors $C_1$–$C_3$, $C_1'$, $C_2'$ are here of a conventional configuration having a bottom plate (not shown) disposed on the gallium arsenide surface 40, a dielectric of silicon nitride (not shown) disposed on such bottom plate and a top plate (not numbered) disposed on the dielectric. Resistors $R_1$–$R_3$, $R_1'$, $R_2'$ are here open gate MESFETS.

A circuit was constructed in accordance with FIGS. 3–5.

Four 150 m drain periphery FETS were used in each channel. FET 1–FET 8 were fabricated on n-type GaAs, doped with silicon to a channel concentration of about $2 \times 10^{17}$ carrier/cm$^3$. Drain and source contact layers 0.2 $\mu$m thick having a dopant concentration of $2 \times 10^{18}$ carrier/cm$^3$ were used to provide ohmic contact to drain and source electrodes.

The gate electrodes was e-beam written each having a lenqth of 0.75 $\mu$m and a width of 75 $\mu$m. The drain channel was adjusted to give $-2$V pinch-off voltage for this example.

The small signal performance of this device is shown in FIGS. 6A–6D. Port 1 corresponds to input terminal 22a, port 2 to input terminal 22b and port 3 to output terminal 24. R.F. performance was characterized by "S" parameters as defined in the table.

Figure 6A:
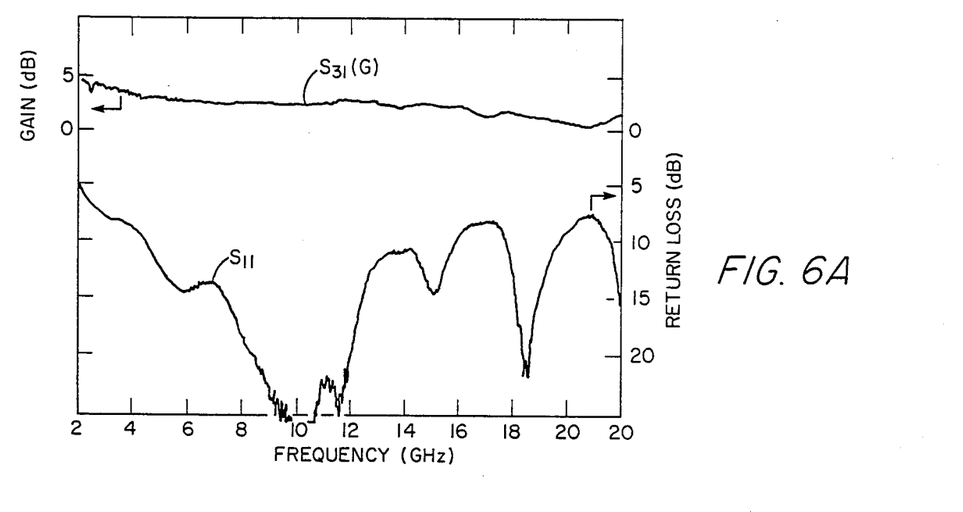
FIGS. 6A-6F are plots of magnitude (db) vs. frequency showing the small signal power performance of a circuit as described in conjunction with FIGS. 3 and 5 with arrows from the plots indicating the corresponding scale in magnitude.
Figure 6B:
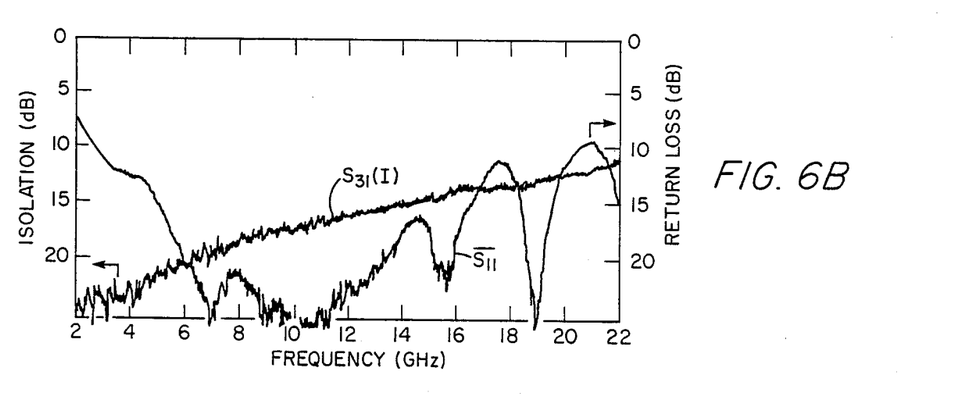
Figure 6C:
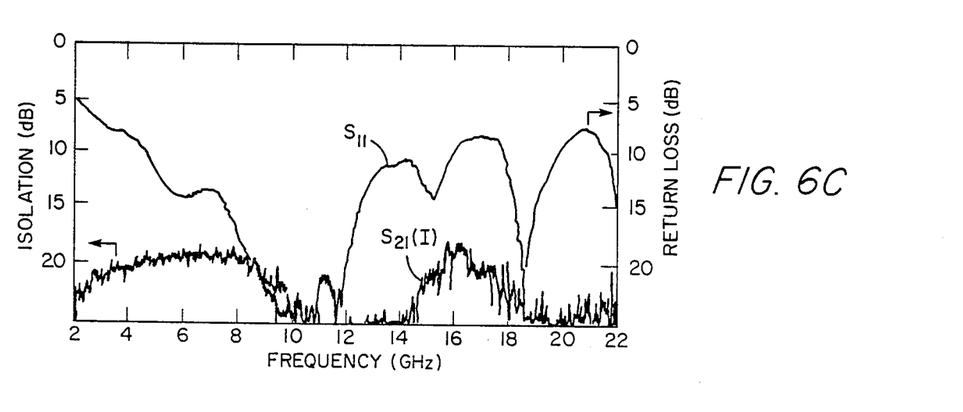
Figure 6D:
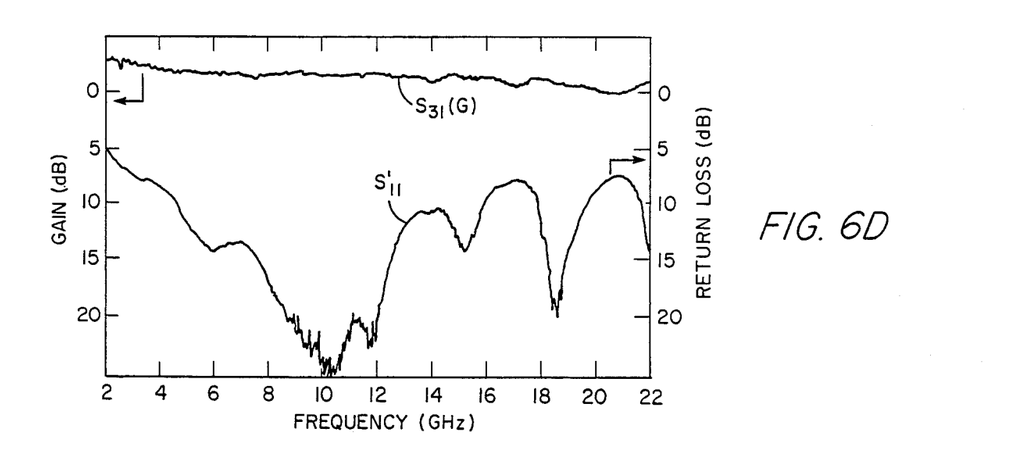
Figure 6E:
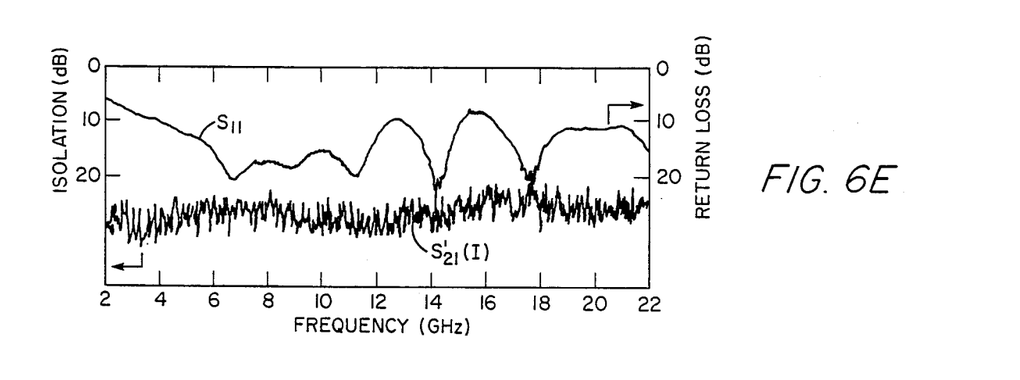
Figure 6F:
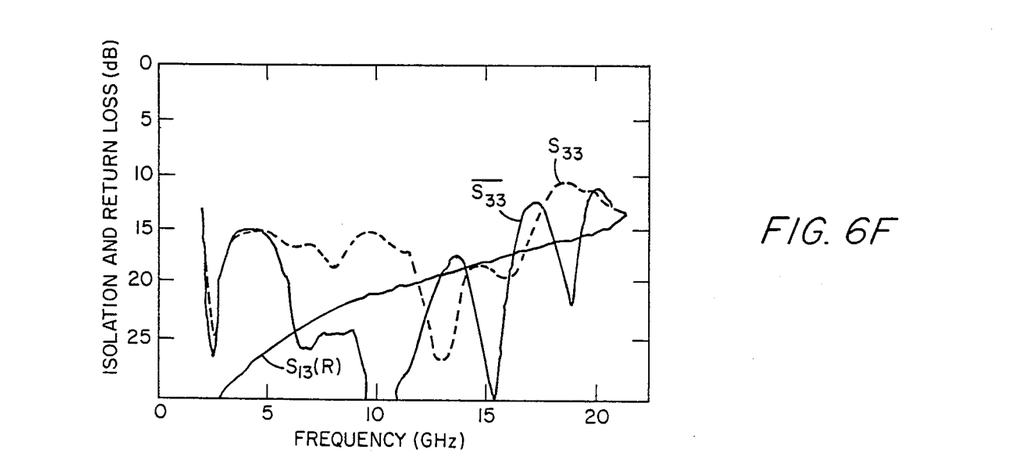

FIG. 6A shows small signal power gain and input return loss of the device 20 used as a 2×1 switch, when port 1 is on and port 2 is biased off. FIG. 6B shows input-to-input isolation with port 1 on and port 2 off.

As a switch, the circuit 20 has at least 1 db of gain over the band of 2–20 GHz and has at least 20 db of isolation (port 1 to port 2) over the band of 2–20 GHz.

With the device 20 used as an r.f. combiner, 0–3 db of gain over the band of 2–20 GHz was provided. This compares with 3 db loss inherent in passive power combining schemes along with insertion loss of the passive combiner.

TABLE

| Function | Port "1" | Port "2" | "S" Par. | FIG. |
|---|---|---|---|---|
| Forward Gain | SW | ON | OFF | $S_{31}$(G) | 6A |
| Forward Gain | SW | OFF | ON | $S_{32}$(G) | (see 6A) |
| Forward Gain | RF/C | ON | ON | $S'_{31}$(G) | 6D |
| Forward Gain | RF/C | ON | ON | $S'_{32}$(G) | 6D |
| Forward Isolation | SW | ON | OFF | $S_{32}$(I) | (see 6B) |
| Forward Isolation | SW | OFF | ON | $S_{31}$(I) | 6B |
| Input Isolation | SW | ON | OFF | $S_{21}$(I) | 6C |
| Input Isolation | RF/C | ON | ON | $S'_{21}$(I) | 6E |
| Input Isolation | RF/C | ON | ON | $S'_{12}$(I) | (see 6E) |
| Reverse Isolation | SW | ON | OFF | $S_{13}$(R) | 6F |
| Reverse Isolation | SW | OFF | ON | $S_{23}$(R) | (see 6F) |
| Input Return Loss | SW | ON | OFF | $S_{11}$ | 6A |
| Input Return Loss | SW | OFF | ON | $\overline{S_{11}}$ | 6B |
| Input Return Loss | RF/C | ON | ON | $S'_{11}$ | 6D |
| Output Return Loss | SW | ON | OFF | $S_{33}$, $\overline{S_{33}}$ | 6F | where (G) refers to gain, (I) denotes isolation, R denotes reverse isolation, (SW) refers to the circuit configured as a switch and (RF/C) refers to the circuit operating an an r.f. combiner.

Having described a preferred embodiment of the invention, it will now be apparent to one of skill in the art that other embodiments incorporating its concept may be used. It is felt, therefore, that this invention should not be limited to the disclosed embodiments, but rather should be limited only by the spirit and scope of the appended claims.

What is claimed is:

1. A distributed r.f. amplifying switch r.f. combiner circuit having first and second input terminals and an output terminal, comprising:
   a first plurality of successively coupled transistors, each one thereof having an input electrode, an output electrode, and a grounded electrode, each one of such transistors having the input electrode thereof coupled to the first input terminal and each one of such transistors having the output electrode coupled to the output terminal;
   a second plurality of successively coupled transistors, each one thereof having an input electrode, an output electrode, and a grounded electrode, each one of such transistors having the input electrode thereof coupled to the second input terminal and each one of such transistors having the output electrode thereof coupled to the output terminal;
   output coupling means for electrically interconnecting the output electrode of each one of said transistors to the output terminal and for feeding a bias signal to each one of the output electrodes;
   a first bias means for selectively feeding a first bias to the input electrode of each one of the first plurality of transistors;
   a second bias means for selectively feeding a second bias to the input electrode of each one of the second plurality of transistors; and
   wherein first and second input signals are fed to first and second input terminals and said first and second bias means both fed bias signals to respective first and second pluralities of successively coupled transistors to provide at the output terminal in a first mode of operation an output signal which is the combination of said first and second input signals, and during a second mode of operation one of said first and second bias signals are fed to the respective one of said first and second pluralities of successively coupled transistors to provide at said output terminal the respective one of said first and second input signals.

2. The distributed amplifying switch/r.f. combiner circuit as recited in claim 1 wherein the output electrode of each one of the first plurality of transistors being connected at a corresponding one of a plurality of common junctions with the output electrode of each one of the second plurality of transistors.

3. The distributed amplifier/switch/combiner circuit as recited in claim 2 wherein the coupling means includes a microstrip transmission line, with the common junctions spaced along said microstrip transmission line.

4. The distributed amplifier/switch/combiner circuit as recited in claim 3 wherein each transistor includes a reactive element between the output electrode and grounded electrode and wherein the coupling means includes a first microstrip transmission line having a characteristic impedance in accordance with the impedance of the reactive element of each transistor to provide the circuit with a predetermined output impedance.

5. The distributed amplifier/switch/combiner circuit as recited in claim 4 further comprising a second microstrip transmission line electrically successively interconnecting each one of the input electrodes of the first plurality of transistors to the input terminal, and a third microstrip transmission line for electrically successively interconnected each one of the input electrodes of the second plurality of tranistors to the input terminal.

6. The distributed amplifier/switch/combiner circuit as recited in claim 5 further comprising:
a reactive componenr between the input electrode and grounded electrode of each transistor; and
wherein the second and third microstrip transmission lines each have an impedance in accordance with the impedance of the reactive element oetween respective input electrodes and qrounded electrodes to provide the circuit with a predetermined input impedance.

7. The distributed amplifier/switch/combiner circuit of claim 1 where the first and second bias means each include two series connected resistors and a capacitor connected between the connection or the resistors and ground.

8. A distributed circuit comprising:
a first plurality of successively coupled field effect transistors having successively connected gate electrodes, and successively connected drain electrodes, each one of such field effect transistors having the gate electrode thereof coupled to the first input terminal fed by a first radio frequency signal,and the last one of the successively coupled field effect transistors having the drain electrode thereof coupledto the output terminal;
a second like plurality of successively coupled field effect transistors having successively connected gate electrodes, successively connected drain electrodes, each one of such field effect transistors having the gate electrode thereof coupled to the second input terminal fed by a second, different radio frequency signal, and the last one of the successively coupled field effect transistors having the drain electrode thereof coupled to the output terminal for producing a second, different amplified radio frequency signal;
a common coupling means, for electrically interconnecting the drain electrode of each one of the field effect transistors to the output terminal of the distributed circuit with the output electrode of each one of the first plurality of transistors being connected at a corresponding one of a plurality of common junctions with the output electrode of each one of the second plurality of transistors;
first input bias means for selectively feeding a first bias to the input electrode of the first plurality of transistors;
second input bias means for selectively feeding a second bias to the input electrode of the second plurality of transistor; and
means including said first and second bias means for selectively switching the corresponding first and second pluralities of transistors to selectively provide in response to said first and second input frequency signals, a corresponding one of a first and second output radio frequency signals at the output terminal during a first mode of operation, and for providing during a second mode of operation an output signal at the output terminal in response to both of the first and second input signals.

9. The distributed circuit as recited in claim 8 wherein the common coupling means includes a microstrip transmission line.

10. The distributed circuit as recited in claim 8 wherein each field effect transistor includes a reactive element between drain and source electrodes, and wherein the common coupling means includes a microstrip transmission line having a characteristic impedance in accordance with the impedance of the reactive element to provide the distributed circuit with a predetermined output impedance.

11. The distributed circuit as recited in claim 10 further comprising:
a first input coupling means for electrically successively interconnecting each one of the successively connected gate electrodes of the first plurality of field effect transistors to the first input terminal; and
a second input coupling means for electrically successively interconnecting each one of the gate electrodes of the second plurality of field effect transistors to the second input terminal.

12. The distributed circuit as recited in claim 11 further comprising:
each field effect transistor including a reactive component between gate and source electrodes; and
wherein each one of the input coupling means comprises a microstrip transmission line having an impedance in accordance with the impedance of the reactive element between gate and source electrodes to provide the distributed circuit with a predetermined input impedance.

* * * * *

UNITED STATES PATENT AND TRADEMARK OFFICE
CERTIFICATE OF CORRECTION

PATENT NO. : 4,772,858
DATED : Sept. 20, 1988
INVENTOR(S) : Toshikazu Tsukii, Yalcin Ayasli It is certified that error appears in the above-identified patent and that said Letters Patent is hereby corrected as shown below:

Column 4, line 20, delete "$T_{8}-T_{10}$" and replace with --$T_8-T_{10}$--.

Column 4, line 66, delete "T, T 40." and replace with --T, T'.--.

Column 5, line 55, delete "5".

Column 5, line 65, delete "mission" and replace with --mission--.

Column 9, line 27, delete "componenr" and replace with --component--.

Column 9, line 31, delete "oetween" and replace with --between--.

UNITED STATES PATENT AND TRADEMARK OFFICE
CERTIFICATE OF CORRECTION

PATENT NO. : 4,772,858

DATED : Sept. 20, 1988

INVENTOR(S) : Toshikazu Tsukii, Yalcin Ayasli

It is certified that error appears in the above-identified patent and that said Letters Patent is hereby corrected as shown below:

Column 9, line 50, delete "coupledto" and replace with
--coupled to --.

Signed and Sealed this

Thirteenth Day of June, 1989

Attest:

DONALD J. QUIGG

Attesting Officer

Commissioner of Patents and Trademarks